(12) United States Patent
Vlasov et al.

(10) Patent No.: US 11,355,948 B2
(45) Date of Patent: Jun. 7, 2022

(54) WIRELESS CHARGING SYSTEMS AND METHODS FOR INCREASING POWER TRANSFER FUNCTIONS

(71) Applicant: Logitech Europe S.A., Lausanne (CH)

(72) Inventors: Maxim Vlasov, Geneva (CH); Laurent Plancherel, Lausanne (CH)

(73) Assignee: Logitech Europe S.A., Lausanne (CH)

( * ) Notice: Subject to any disclaimer, the term of this patent is extended or adjusted under 35 U.S.C. 154(b) by 353 days.

(21) Appl. No.: 16/457,025

(22) Filed: Jun. 28, 2019

(65) Prior Publication Data

US 2020/0412157 A1    Dec. 31, 2020

(51) Int. Cl.
| | |
|---|---|
| *H02J 7/02* | (2016.01) |
| *H02J 50/12* | (2016.01) |
| *H03K 19/21* | (2006.01) |
| *G06F 3/039* | (2013.01) |
| *G06F 3/038* | (2013.01) |
| *G06F 3/0354* | (2013.01) |

(52) U.S. Cl.
CPC .............. *H02J 7/025* (2013.01); *G06F 3/038* (2013.01); *G06F 3/0395* (2013.01); *G06F 3/03543* (2013.01); *H02J 50/12* (2016.02); *H03K 19/21* (2013.01)

(58) Field of Classification Search
CPC .. H02J 7/025; H02J 50/10; H02J 50/12; H02J 50/005; H02J 50/80

USPC ......................................................... 307/104
See application file for complete search history.

(56) References Cited

U.S. PATENT DOCUMENTS

| | | | |
|---|---|---|---|
| 2012/0146425 A1* | 6/2012 | Lee | H04B 5/0093 307/104 |
| 2017/0256978 A1* | 9/2017 | Sauterel | H02J 50/005 |
| 2018/0351389 A1* | 12/2018 | Morier | G06F 3/038 |

* cited by examiner

*Primary Examiner* — John W Poos
(74) *Attorney, Agent, or Firm* — Kilpatrick Townsend & Stockton LLP

(57) ABSTRACT

Embodiments describe a wireless charging system including an accessory device and a host device. The host device can include a housing having a charging surface and power transmitting circuitry coupled to a power source. The power transmitting circuitry can include an inductive transmitter coil configured to receive a first power and generate magnetic field, an amplifier coupled to the inductive transmitter coil and configured to output the first power to the inductive transmitter coil, an output sensor coupled to the inductive transmitter coil and configured to measure the first power to the inductive transmitter coil, and a power tracking controller coupled to the sensor probe. The power tracking controller can be configured to receive measurement of the first power, and generate a control signal based on the measured first power to modify an output impedance of the amplifier to output a second power different from the first power.

17 Claims, 8 Drawing Sheets

WIRELESS CHARGING SYSTEMS AND METHODS FOR INCREASING POWER TRANSFER FUNCTIONS

BACKGROUND

Wireless peripheral devices (e.g., computer mice, keyboards, speakers, ear buds, smart wearables, etc.) are widely used and provide portability and convenience, but often suffer from poor battery life. Although battery technology continues to improve, most peripheral devices require a charging cable for extended usage, which can be cumbersome, limiting, and defeat the purpose of wireless technology in general. Some contemporary charging schemes solve this problem by utilizing a charging base to wirelessly charge a peripheral device over time. Improved methods of wireless charging are needed.

BRIEF SUMMARY

In some embodiments, wireless charging system includes an accessory device and a host device. The accessory device can include a processor configured to operate the accessory device, a receiver coil configured to interact with a magnetic field to generate an electrical current, and power receiving circuitry coupled to the receiver coil and the processor, the power receiving circuitry configured to receive the generated electrical current and provide at least a portion of received power to the processor. The host device can include a housing having a charging surface and power transmitting circuitry coupled to a power source. The power transmitting circuitry can include an inductive transmitter coil positioned below the charging surface, the inductive transmitter coil can be configured to receive a first power and generate magnetic field in a region above the charging surface using the first power, an amplifier coupled to the inductive transmitter coil and configured to output the first power to the inductive transmitter coil, an output sensor coupled to the inductive transmitter coil and configured to measure the first power to the inductive transmitter coil, and a power tracking controller coupled to the sensor probe. The power tracking controller can be configured to receive measurement of the first power, and generate a control signal based on the measured first power to modify an operation of the amplifier, where the amplifier can be configured to receive the control signal from the power tracking controller and modify its output impedance to output a second power different from the first power.

The measurement of the first power can include a phase of a first current and phase of a first voltage of the first power. The power tracking controller can be further configured to determine a difference between the phase of the first current and the phase of the first voltage of the first power, perform an exclusive OR (XOR) logic function on the phase of the first current and the phase of the first voltage of the first power, and generate the control signal based on a result of the XOR logic function to cause the amplifier to output the second power different from the first power, where the second power has a phase difference between a phase of a second current and a phase of a second voltage that is near zero. The power tracking controller can be coupled to a sensor configured to measure an input power flowing from the power source. The power tracking controller can be further configured to determine a difference between the input power and the first power, and generate the control signal based on the difference between the input power and the first power to cause the amplifier to output the second power different from the first power. The control signal can be a voltage control signal that modifies a drain voltage for transistors in the amplifier to modify an amplitude of the second power. The amplifier can be a class D amplifier and the control signal is a duty cycle control signal that modifies a duty cycle of the transistors in the amplifier to modify a duty cycle of the second power. The host device can be a powered mouse pad and the accessory device is a computer mouse configured to receive wireless power from the host device while positioned on the charging surface.

In certain embodiments, a charging device for wirelessly charging a computer accessory device includes a housing having a charging surface, and power transmitting circuitry coupled to a power source. The power transmitting circuitry can include an inductive transmitter coil positioned below the charging surface, the inductive transmitter coil configured to receive a first power and generate magnetic field in a region above the charging surface using the first power; an amplifier coupled to the inductive transmitter coil and configured to output the first power to the inductive transmitter coil; and a power tracking controller configured to receive measurement of the first power outputted by the amplifier and generate a control signal based on the first power to modify an operation of the amplifier. The amplifier can be configured to receive the control signal from the power tracking controller and modify its output impedance to output a second power different from the first power.

The measurement of the first power can include a phase of a first current and phase of a first voltage of the first power. The power tracking controller can be further configured to determine a difference between the phase of the first current and the phase of the first voltage of the first power, perform an exclusive OR (XOR) logic function on the phase of the first current and the phase of the first voltage of the first power, and generate the control signal based on a result of the XOR logic function to cause the amplifier to output the second power different from the first power, where the second power has a phase difference between a phase of a second current and a phase of a second voltage that is near zero. The power tracking controller can be coupled to a sensor configured to measure an input power flowing from the power source. The power tracking controller can be further configured to determine a difference between the input power and the first power, and generate the control signal based on the difference between the input power and the first power to cause the amplifier to output the second power different from the first power. The amplifier can be a class D amplifier and the modifying its output impedance can include performing pulse-width modulation to control one or more transistors to output a pulse train having an amplitude and a duty cycle. The control signal can be a voltage control signal that modifies a drain voltage for transistors in the amplifier to modify an amplitude of the second power. The control signal can be a duty cycle control signal that modifies a duty cycle of the transistors in the amplifier to modify a duty cycle of the second power. The host device can be a powered mouse pad and the accessory device is a computer mouse configured to receive wireless power from the host device while positioned on the charging surface.

In some embodiments, a method for providing wireless power from a charging device coupled to a power source to a computer accessory device includes outputting, by a power tracking controller, a first control signal to an amplifier causing the amplifier to output a first power a resonator circuitry for generating a first time-varying magnetic field at a fundamental frequency; receiving, by the power tracking controller, an input signal corresponding to a measured value of the first power outputted by the amplifier; in response to receiving the input signal, generating, by the power tracking controller, a second control signal based on the measured value of the first power; and outputting, by the power tracking controller, the second control signal to the amplifier to modify the output impedance of the amplifier and generate a second power different from the first power, the second power is output to the resonator circuitry for generating a second time-varying magnetic field different from the first time-varying magnetic field at a same fundamental frequency.

The measurement of the first power can include a phase of a first current and phase of a first voltage of the first power. Generating the second control signal based on the measured value of the first power can include determining a difference between the phase of the first current and the phase of the first voltage of the first power, performing an exclusive OR (XOR) logic function on the phase of the first current and the phase of the first voltage of the first power; and generating the control signal based on a result of the XOR logic function to cause the amplifier to output the second power different from the first power, where the second power has a phase difference between a phase of a second current and a phase of a second voltage that is near zero. The power tracking controller can be coupled to a sensor configured to measure an input power flowing from the power source. Generating the second control signal based on the measured value of the first power can include determining a difference between the input power and the first power and generating the control signal based on the difference between the input power and the first power to cause the amplifier to output the second power different from the first power. The first and second control signals can be voltage control signals that are sent to a voltage regulator to modify respective drive voltages of the amplifier. The first and second control signals can be pulse-width modulated signals with the first power having a different duty cycle than the second power.

A better understanding of the nature and advantages of embodiments of the present disclosure may be gained with reference to the following detailed description and the accompanying drawings.

BRIEF DESCRIPTION OF THE DRAWINGS

The detailed description is set forth with reference to the accompanying figures.

DETAILED DESCRIPTION

Figure 1:
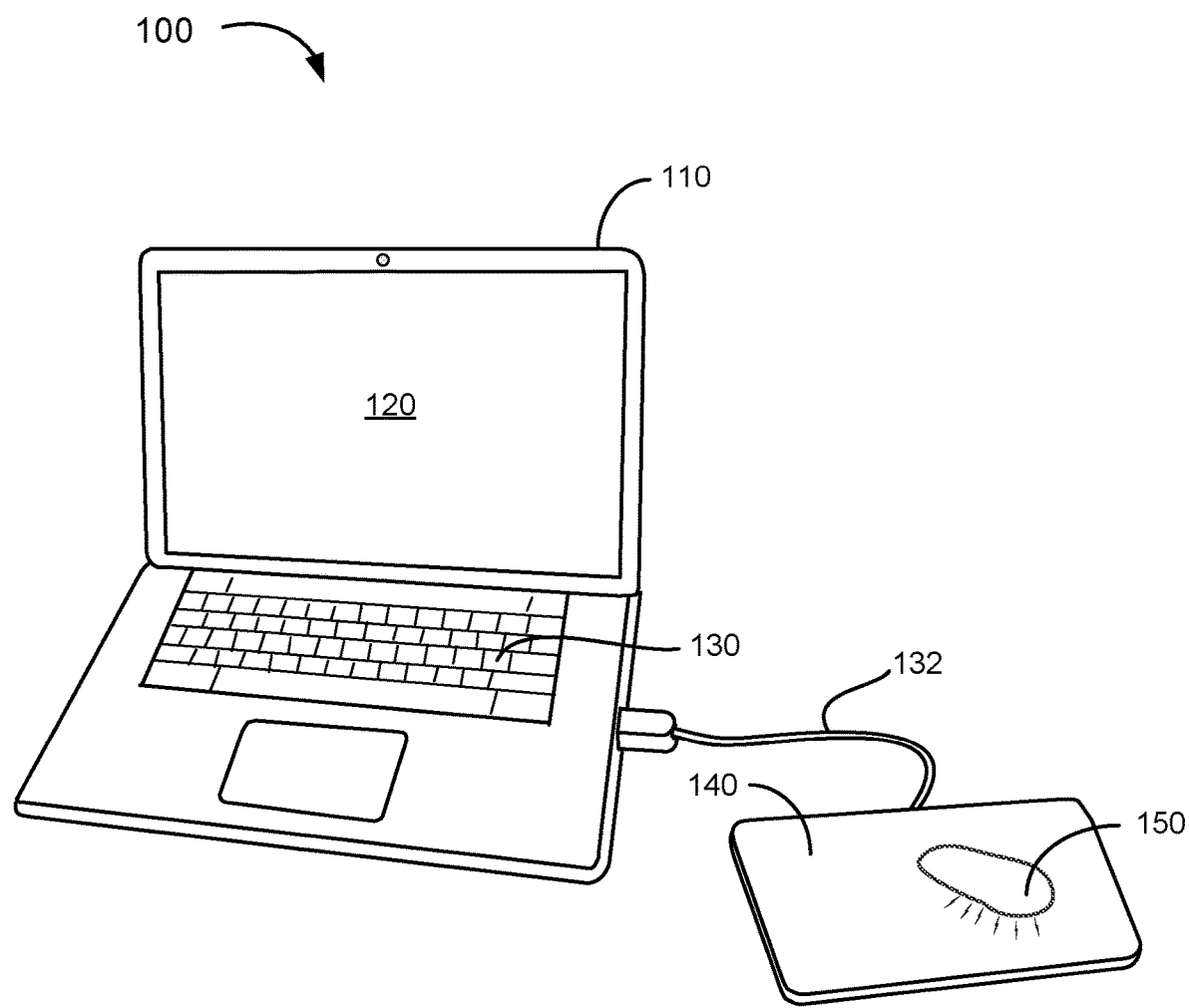
FIG. 1 is a simplified diagram of a wireless charging system, according to some embodiments of the disclosure.

The present disclosure relates in general to input devices, and in particular to the wireless charging of input devices.

In the following description, various embodiments of methods and systems for wirelessly charging an input device will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments of the disclosure provide systems and methods for improved wireless charging of an accessory device via a host device that also functions as a mouse pad upon which the accessory device can move. The host device can be a charging mouse pad that includes an inductive transmitter coil to wirelessly and electromagnetically transfer power to an inductive receiver coil disposed in the accessory device, which can be an input device such as a computer mouse and the like. The frequency at which the transmitter coil operates to generate a time-varying magnetic field to effectuate wireless power transfer can be a specific predetermined operation frequency, such as a fundamental frequency of 6.78 MHz centered in the 6.765-6.795 MHz industrial, scientific, and medical (ISM) band defined by the Federal Communications Commission (FCC). The accessory device can receive enough power from the host device to sustain its operation without the need for power from an auxiliary power source via a power cable.

Varying the relative position between the accessory device and the host device (such as when the accessory device is configured as a computer mouse that moves on a surface of the host device configured as a mouse pad (see, e.g., FIG. 3)) can affect the amount of wave impedance experienced by the charging system. High wave impedance can result when the receiver coil in the accessory device moves farther away from the transmitter coil in the host device. Wave impedance can also be induced in the charging system by electromagnetic interference (EMI) generated by a conductive path through which power is provided to the host device, as will be discussed further herein. When high wave impedance exists, power transmitted at the fundamental frequency decreases, and the difference in fundamental frequency is distributed at harmonics of the fundamental frequency, which ultimately decreases the efficiency at which power is transferred between the host device and the accessory device.

According to some embodiments of the present disclosure, an amplifier in a host device can modify its output impedance to increase its output power to an accessory device thereby increasing the transfer function of the charging system and improving charging efficiency. A power tracking controller can cause the amplifier to modify its output impedance by modifying the amplifier's control voltage and/or modifying a duty cycle of its transistors, which can then alter the operation of the transmitter coil in a way that increases power transfer between the host device and the accessory device (see, e.g., FIGS. 6-10). In some instances, the power point tracking controller can also be utilized by the host device to optimize the efficiency of the host device to output increased power based on an input power from a power source (see, e.g., FIG. 6). These concepts are discussed in detail further herein.

I. Wireless Charging System

FIG. 1 is a simplified diagram of a wireless charging system 100, according to some embodiments of the disclosure. System 100 includes a mobile computing device 110 having a display 120 and a keyboard 130. A charging host device 140 is coupled to computing device 110, and accessory device 150 is resting on host device 140. Mobile computing device 110 can be a tablet computer, desktop computer, laptop computer, or other suitable computing device. Host device 140 can rest on a work surface (e.g., table, desk, etc.) and may be a charging mat such as a computer mouse pad or other suitable device with a surface that accessory device 150 can rest on or move along to receive power from host device 140. Accessory device 150 can be an input device for mobile computing device 110, such as a computer mouse, remote control, or other suitable accessory input device that can input data to mobile computing device 110 and be configured to receive power from host device 140.

Host device 140 can include an inductive transmitter coil configured to generate a time-varying magnetic field. Power for generating the magnetic field can be sourced from mobile computing device 110 via a power cable 132, such as a USB cable. The generated magnetic field can be coupled to and received by accessory device 150 via an internal inductive receiver coil and supporting circuitry, thereby wirelessly transferring power to and charging accessory device 150. Power transfer efficiency between host device 140 and accessory device 150 can be increased by power transmitting circuitry within host device 140, as will be discussed in further detail herein. Accessory device 150 may immediately use the received power for operation, or store the received power in a local energy storage device (i.e., battery) for operating accessory device 150 at a later time.

Figure 2:
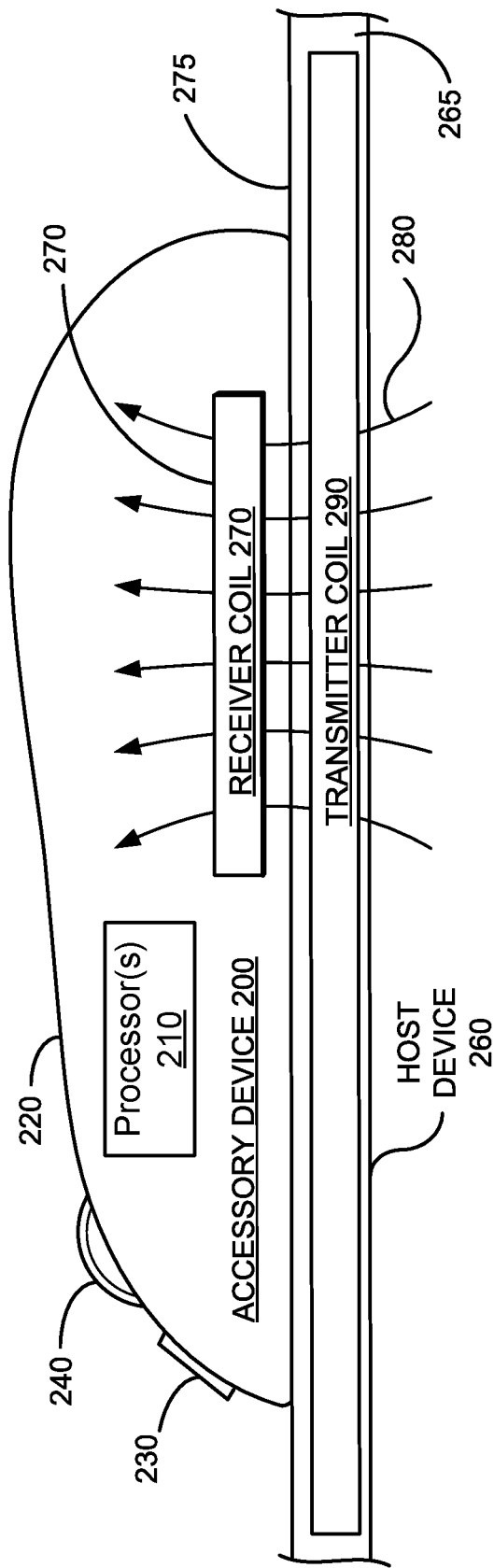
FIG. 2 is a simplified illustration of an accessory device positioned on host device such that a receiver coil within the accessory device can receive power by interacting with magnetic fields generated by a transmitter coil within the host device, according to certain embodiments of the disclosure.

FIG. 2 is a simplified illustration of an accessory device 200 positioned on a host device 260 such that a receiver coil 270 within accessory device 200 can receive power by interacting with magnetic fields 280 generated by a transmitter coil 290 within host device 260, according to certain embodiments of the disclosure. Accessory device 200 can be a computer mouse, remote control, or other suitable accessory device, and can include one or more processors 210, a housing 220, button(s) 230, scroll wheel 240, and receiver coil 270. Buttons 230, scroll wheel 240, or other conventional functions (e.g., movement tracking, touch detection, etc.) of accessory device 200 can be controlled by processor(s) 210. Accessory device 200 can further include an energy storage device, such as a battery, (not shown) to store power received from host device 260 by receiver coil 270. In some embodiments, host device 260 can include a communication device (not shown) to enable communication between accessory device 200 and host device 260. Host device 260 can include a housing 265 having a charging surface 275 upon which accessory device 200 can rest to receive wireless power. Transmitter coil 290, as well as power transmitting circuitry for operating transmitter coil 290 can be enclosed within housing 265. The efficiency at which power is transmitted from transmitter coil 290 to receiver coil 270 largely depends on the degree of separation between them, as discussed herein with respect to FIG. 3.

Figure 3:
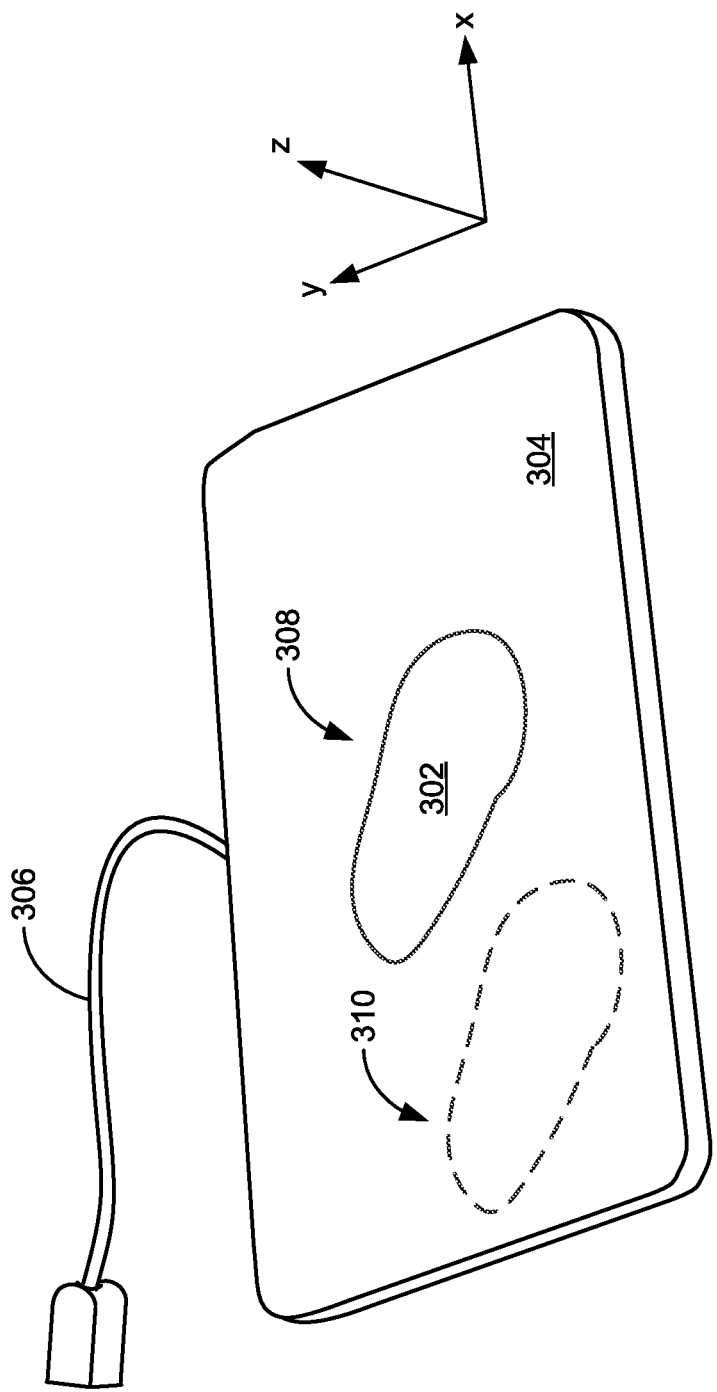
FIG. 3 is a perspective view illustration of a wireless charging system where an accessory device is positioned at various locations on a host device 304.

FIG. 3 is a perspective view illustration of a wireless charging system 300 where an accessory device 302 is positioned at various locations on a host device 304. In an ideal situation, all of the available power generated by host device 302 is transferred to accessory device 302 at the fundamental frequency and no harmonics exist. Such situations may occur when host device 304 is an isolated system from the utility grid such that it has its own power source (e.g., energy storage device) from which to use to generate magnetic fields during wireless power transfer.

However, in other situations, host device 302 may be coupled to the utility grid via a power cable 306 directly coupled to a wall outlet, or via power cable 306 indirectly coupled to the wall outlet through a mobile computing device (e.g., mobile computing device 110 in FIG. 1 shown as a laptop). When coupled to the grid, host device 302 can receive an unlimited supply of power instead of a limited amount of power in instances where host device 302 uses its own limited power supply. However, the electrical connections through the wall can inadvertently act like an antenna and generate electromagnetic interference (EMI) when high current flows through the electrical connections in the wall and power cable 306, such as during operation of an asymmetrical, unbalanced transmitter coil in host device 302. In situations where host device 302 is not coupled to the grid but is connected to accessory device 304 via power cable 306, power cable 306 can still act as an antenna and generate EMI. The generated EMI can result in the generation of wave impedance in the wireless charging system, which can cause reflection of power transmitted at the fundamental frequency. This can in turn decrease the amount of power transmitted at the fundamental frequency and cause at least some the power intended for transmission at the fundamental frequency to be distributed at harmonic frequencies, e.g., sidebands, outside of the fundamental frequency. Power existing at the harmonic frequencies can sometimes be captured by the receiver coil in accessory device 304 and used to provide power to accessory device 304; but, the existence of power at the harmonic frequencies often negatively impacts the power transfer operation of host device 302. In some situations, host device 302 cannot filter out the harmonics due to cost and/or design constraints. However, even if the harmonics were filtered out, the amount of power transferred at the fundamental frequency may not be enough to power and/or charge accessory device 304. This problem is further exacerbated by the relatively low input power limitations caused by power cable 306, which can be configured as a USB cable connection. The low input power limitations can result in lower tolerances for power loss during wireless power transfer.

In addition to the generation of impedance from EMI originating from electrical connections to the utility grid, impedance can also be generated based on the relative positioning of host device 302 and accessory device 304. Larger separation distances between host device 302 and accessory device 304 may result in larger impedances, whereas smaller separation distances may result in lower impedances. The distance between host device 302 and accessory device 304 may not be solely defined by the degree of separation in the z-direction; rather, the distance may also be defined by the degree of separation in the x and y directions. For instance, if the transmitter coil is centered at the center of host device 302, lower impedances may be generated when accessory device 302 is positioned at location 308, whereas higher impedances may be generated when accessory device 302 moves away from the center, e.g., when accessory device 302 is moved to location 310. Larger impedances can decrease the efficiency at which power is transmitted between host device 302 and accessory device 304.

Figure 4:
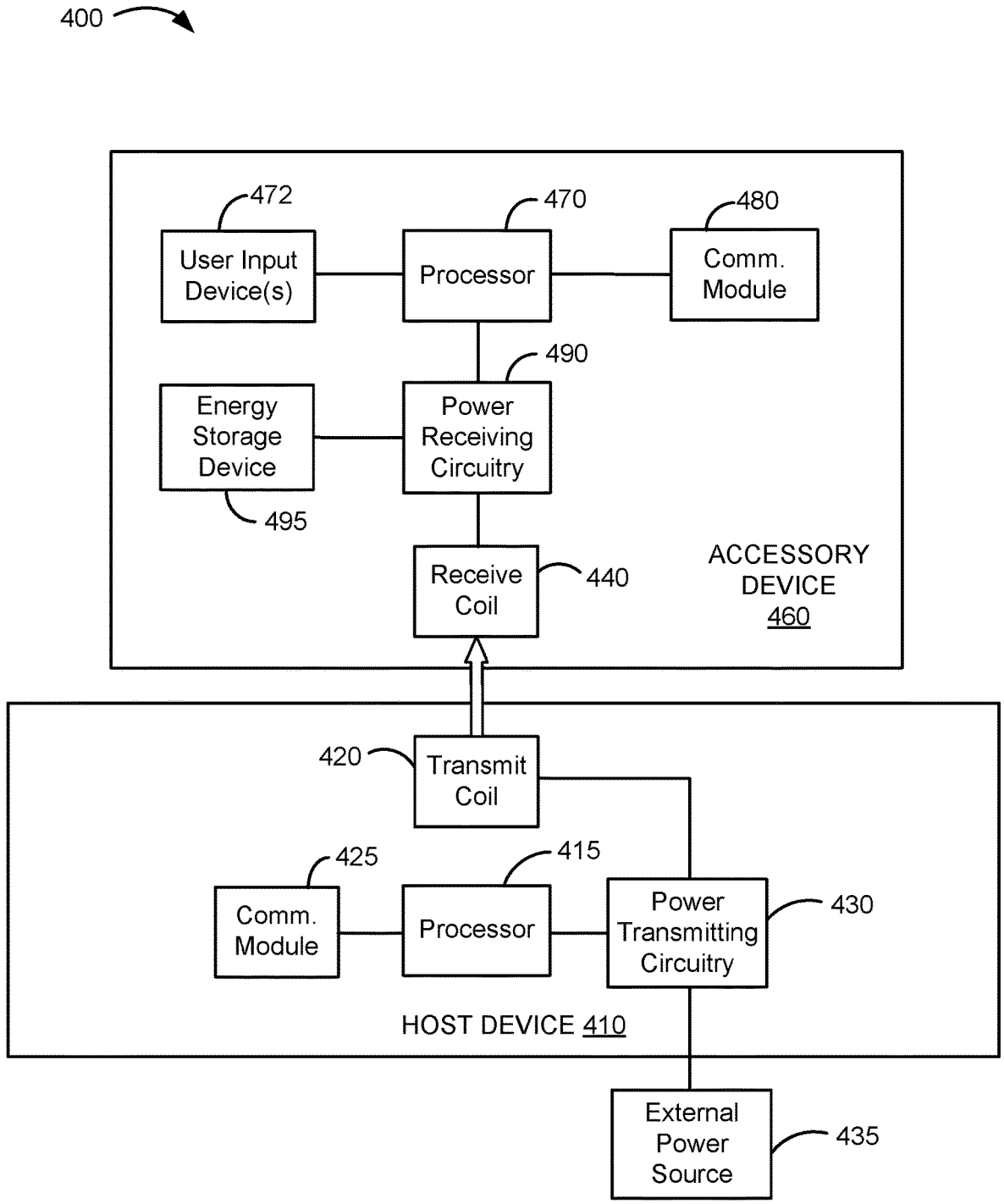
FIG. 4 is a block diagram of an exemplary wireless charging system including an accessory device and a host device, according to certain embodiments of the disclosure.

To minimize the impact of impedance during operation of the wireless charging system and to increase the transfer function between the host device and the accessory device, modifications can be made to one or more components within the host device. FIG. 4 is a block diagram of an exemplary wireless charging system 400 including an accessory device 460 and a host device 410, according to certain embodiments of the disclosure. In this example, accessory device 460 is a wireless computer mouse and host device 410 is a powered mouse pad that is coupled to an external power source 435. Host device 410 can provide enough continuous wireless power such that accessory device 460 can operate and/or store charge in its local energy storage device without wired connections to a power source while it is stationary or moving around on host device 410.

As shown in the exemplary embodiment in FIG. 4, accessory device 460 can include a processor 470 coupled to user input device(s) 472 and communication module 480. Processor 470 can be any suitable type of processor(s), such as one or more microprocessors (μCs), microcontrollers (MCUs), digital signal processors (DSPs), or the like, with supporting hardware and/or firmware (e.g., memory, programmable I/Os, etc.), as would be appreciated by one of ordinary skill in the art. Processor 470 can control the function of accessory device 460 by interacting with user input device(s) 472 and communication module 480. User input device(s) can be any suitable device used for inputting signals to processor 470, such as, but not limited to, a roller (e.g., scroll wheel), LEDs, buttons, sensors (e.g., touch sensors), and the like. Communication module 480 can be any suitable component(s) for enabling wireless data transmission and reception with an external device, such as an antenna for use with any communication protocol including, but not limited to, radio-frequency (RF), Bluetooth, Bluetooth LE, infra-red, Zigbee, or other suitable communication technology to enable wireless communication between accessory device 460 and an associated computing device (e.g., laptop computer, desktop computer, tablet computer, etc.) and/or with host device 410.

Accessory device 460 can also include power receiving circuitry 490 coupled to an energy storage device 495 and processor 470. Energy storage device 495 can be any suitable device capable of storing energy that can be later discharged during operation, such as a lithium ion battery. In some instances, energy storage device 495 is a rechargeable energy storage device that can receive and store charge from an external power supply. For example, accessory device 460 can include an inductive receiver coil 440 that can interact with time-varying magnetic fields to generate current. The generated current can be used by power receiving circuitry 490 to store charge in energy storage device 495. The time-varying magnetic fields can be generated by an external device, such as host device 410.

Host device 410 can include a processor 415 coupled to a communication module 425 and power transmitting circuitry 430. Communication module 425 can be any suitable communication module discussed herein with respect to communication module 480. Communication module 425 can enable processor 415 of host device 410 to communicate with communication module 480 of accessory device 410. That way, pertinent information regarding wireless charging, such as level of stored power in energy storage device 495, device identification, operating status, and the like can be communicated between host device 410 and accessory device 460. Host device 410 can also include an inductive transmitter coil 420 coupled to power transmitting circuitry 430. Transmitter coil 420 can be driven with alternating current to generate time-varying magnetic fields. The generated magnetic fields can interact with receiver coil 440 and generate a current in receiver coil 440 for providing power to store in energy storage device 495 or to use by processor 470 to operate accessory device 460.

As discussed herein with respect to FIG. 3, EMI from the surrounding environment and the relative positioning between the host device and accessory device can create impedance and cause distribution of power at harmonic frequencies. To mitigate impedance and the negative effects of EMI, modifications to certain components of host device 410 can be made. For instance, power transmitting circuitry 430 can be modified to mitigate impedance and the negative effects of EMI to increase the transfer function, as will be discussed further herein with respect to FIGS. 5-6.

II. Modifying Frequency of Resonator to Increase Transfer Function

Figure 5:
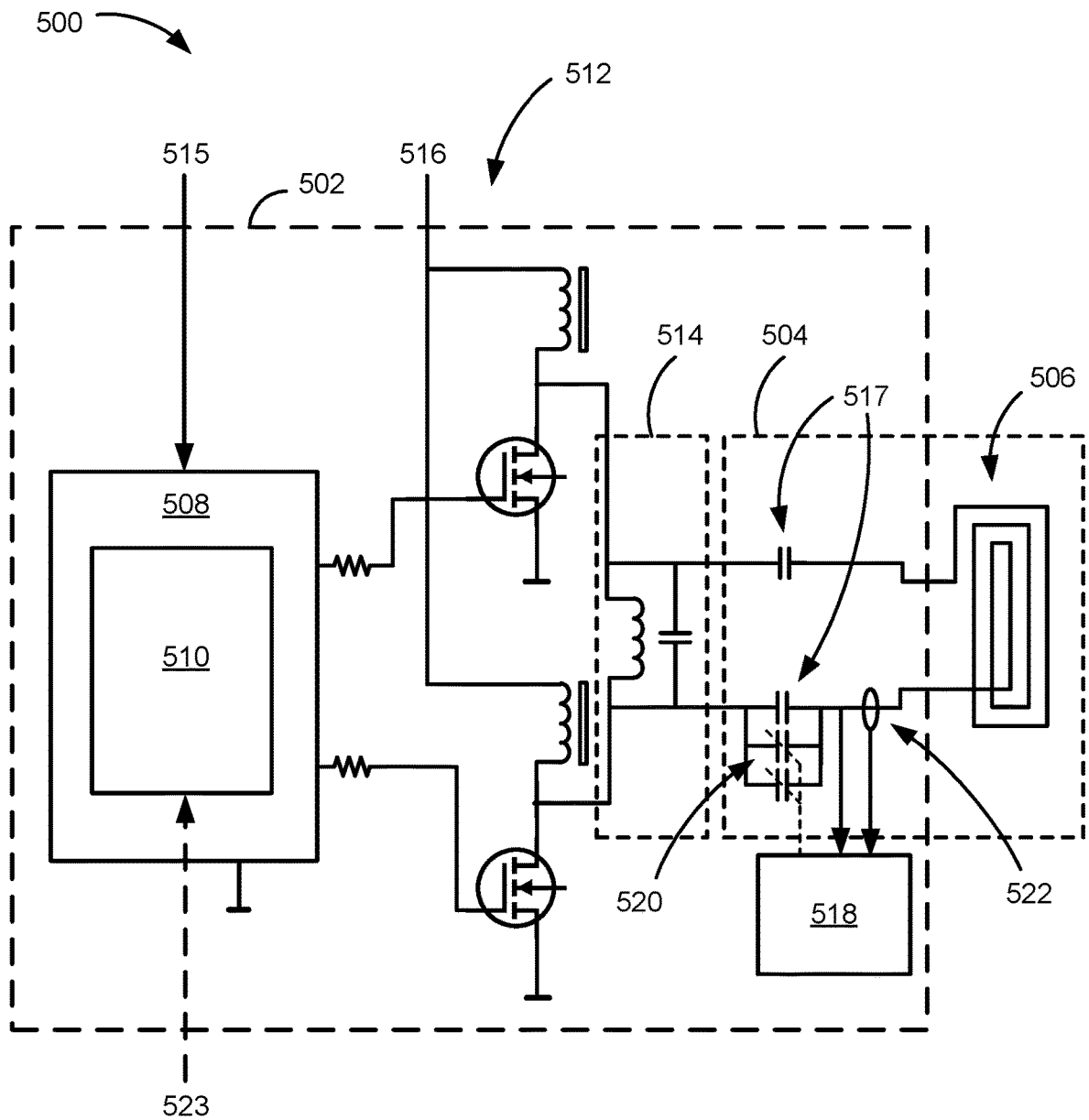
FIG. 5 is a circuit diagram of a power transmitting circuitry configured to modify the capacitance of its resonator to alter the operation of a transmitter coil to improve power transmission efficiency with a receiver coil.

FIG. 5 is a circuit diagram 500 of power transmitting circuitry 502 configured to modify the capacitance of its resonator 504 to alter the output frequency of transmitter coil 506 to improve power transmission efficiency with a receiver coil. Power transmitting circuitry 502 can include an signal generator module 508 including control logic 510 coupled to an amplifier 512, whose output is provided to a resonant circuit 514 and resonator 514, which can then generate a time-varying magnetic field. Control logic 510 can be logic that is configured to control an output waveform of signal generator module 508. Signal generator module 508 can receive input power 515 from an external power source (not shown) and then output a waveform to amplifier 512, which can then output a modified waveform to resonant circuit 514. Resonant circuit 514 can be a inductor-capacitor (LC) tank that can in turn output a waveform to resonator 504, which can include one or more capacitors 517 and transmitter coil 506.

During wireless power transfer, the operation frequency of resonator 504 may not match the operation frequency of a receiver coil in the accessory device due to the relative positioning between the host device and the accessory device. The mismatch in frequency can generate impedance, as aforementioned herein, which can negatively impact the transfer function and decrease power transfer efficiency. Thus, one way to rectify the mismatch in operation frequency is to modify resonator 504 so that it can dynamically alter its operating frequency to match the operating frequency of the receiver coil. When the operating frequency of resonator 504 matches the operating frequency of the receiver coil, the power transfer function can be increased. In certain cases, resonator 504 can be modified to include a set of capacitors 520 arranged in parallel and one or more sensors 522 coupled to an automatic impedance matching unit 518 for measuring voltage and/or current along a conductive line of transmitter coil 506. Automatic impedance matching unit 518 can be coupled to sensors 522 to receive the voltage and/or current measurement along the conductive line. The measurement may be of return power in the conductive line from the receiver coil, and the amount of return power can be indicative of the power transfer efficiency. If the measurement indicates that the power transfer efficiency is low, such as when there is a mismatch of operating frequency, automatic impedance matching unit 518 can enable and/or disable one or more capacitors of the set of capacitors 520 to modify the frequency of the time-varying magnetic field generated by transmitter coil 506 to match the operating frequency of the receiver coil. Instead of, or in addition to, using sensors 522 to modify the frequency of resonator 504, control logic 510 can be configured to communicate with the accessory device via communication line 523. The accessory device can communicate its amount of power and the rate at which it is receiving power so that control logic 510 can modify the operation of resonator 504 to increase the power transfer function.

Modifying resonator 504 to dynamically modify its operating frequency can be costly, however. Each capacitor of the set of capacitors 520 and each current and voltage sensor used to measure the current and voltage in the conductive line of the transmitter coil 506 can be expensive. According to some embodiments of the present disclosure, instead of modifying the capacitance of the resonator to modify the output frequency of the magnetic field, an output impedance of the amplifier can be modified to increase power transfer efficiency, as will be discussed further herein with respect to FIG. 6.

III. Modifying Output Impedance of Amplifier to Increase Transfer Function

Figure 6:
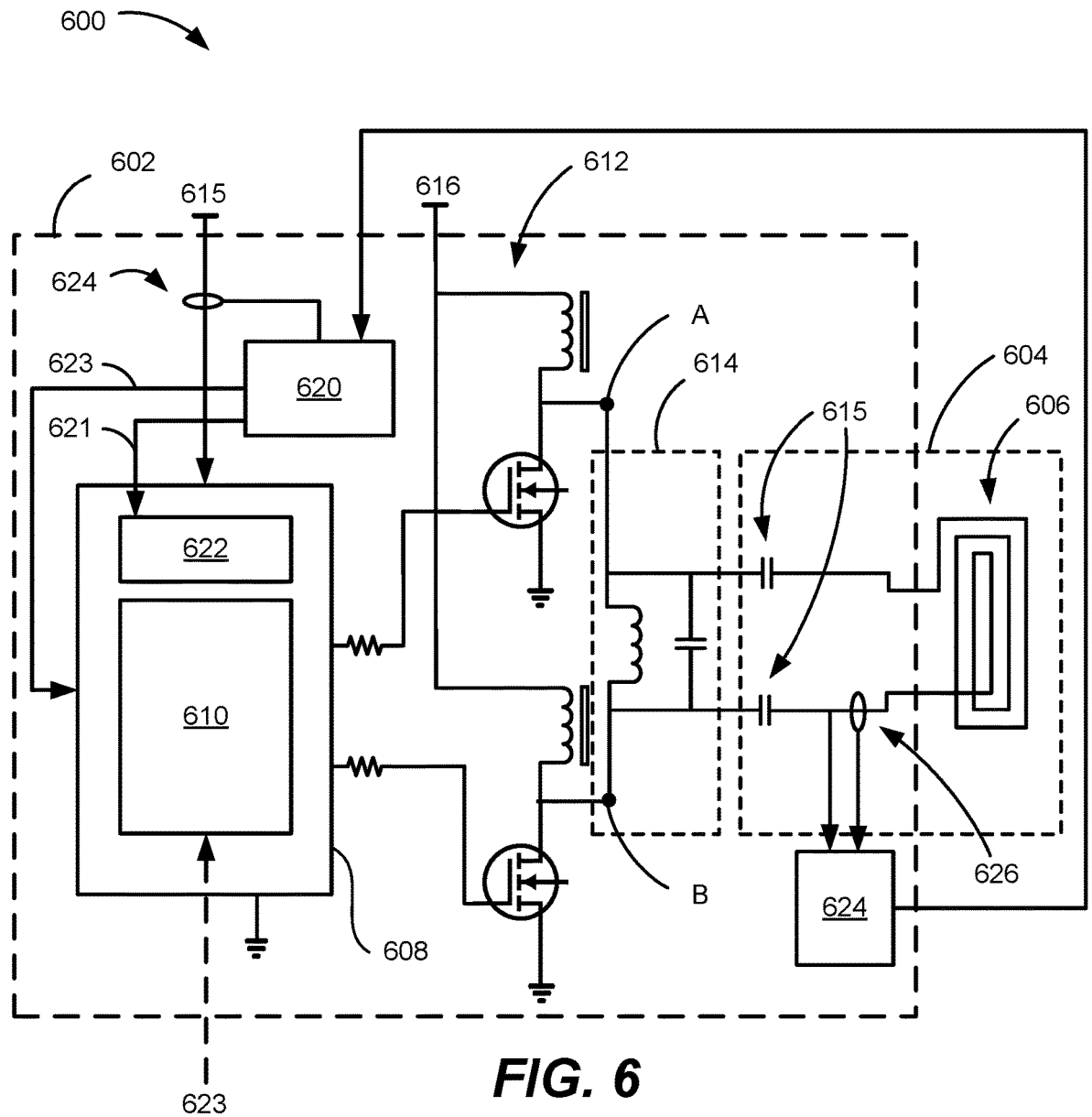
FIG. 6 is a circuit diagram of a power transmitting circuitry configured to modify the output impedance of its amplifier to improve power transmission efficiency, according to some embodiments of the present disclosure.

FIG. 6 is a circuit diagram 600 of power transmitting circuitry 602 configured to modify the output impedance of its amplifier to improve power transmission efficiency, according to some embodiments of the present disclosure. Like power transmitting circuitry 502 in FIG. 5, power transmitting circuitry 602 can include a signal generator module 608 including control logic 610 coupled to an amplifier 612, whose output is provided to an inductor-capacitor (LC) tank 614 and a resonator 604 for generating a time-varying magnetic field at a specific frequency and amplitude. Control logic 610 can be logic that is configured to control an output waveform of signal generator module 608. Signal generator module 608 can receive input power 615 from an external power source (not shown) and then output a waveform to amplifier 612, which can then output a pulse train to LC tank 614. LC tank 614 can in turn output a waveform to resonator 604, which can include one or more capacitors 617 and transmitter coil 606, based on the output pulse train.

In some embodiments, a voltage regulator 622 can be implemented within signal generator module 608, and control logic 610 can be configured to control the operation of voltage regulator 622 in addition to the operation of signal generator module 608. Voltage regulator 622 can be configured to control drive voltage 616 of amplifier 612, and control logic 610 can be configured to control the duty cycle of amplifier 612. Although FIG. 6 illustrates control logic 610 as being implemented within signal generator module 608, embodiments are not limited to such configurations. Some embodiments can implement control logic 610 separate from signal generator module 608 or within another component without departing from the spirit and scope of the present disclosure.

During wireless power transfer, the operation frequency of resonator 604 may not match the operation frequency of a receiver coil in the accessory device due to a separation distance between the host device and the accessory device. The mismatch in frequency can generate impedance, as aforementioned herein, which can negatively impact the transfer function and decrease power transfer efficiency. Thus, some embodiments of the present disclosure can rectify the mismatch in operation frequency by modifying the output impedance of amplifier 612, instead of modifying the output frequency of resonator 604, according to the degree of separation between the accessory device and the host device. When the output impedance is tuned based on the position of the accessory device, the power transfer function can be increased. In some embodiments, modification of the output impedance of amplifier 612 can be achieved even though amplifier 612 has a non-linear output function.

According to some embodiments of the present disclosure, power transmitting circuity 602 can steer the output impedance of amplifier 612 (e.g., the impedance across terminal A-B) by modifying a drive voltage 616 of amplifier 612 and/or modifying its duty cycle to output a unique pulse train. The pulse train can cause resonator 604 to generate a time-varying magnetic field that increases the transfer function with the accessory device. Power transmitting circuitry 602 can dynamically change the output impedance based on the instantaneous position of the accessory device to maintain the improved power transfer function across various positions on the host device. To enable this, amplifier 612 can be a class D amplifier that can perform pulse-width modulation on an input signal. Different from linear gain amplifiers, class D amplifiers are switching amplifiers that operate as electronic switches that receive an input signal and output a pulse train where each pulse of the pulse train has a specific amplitude and duty cycle.

Figure 7:
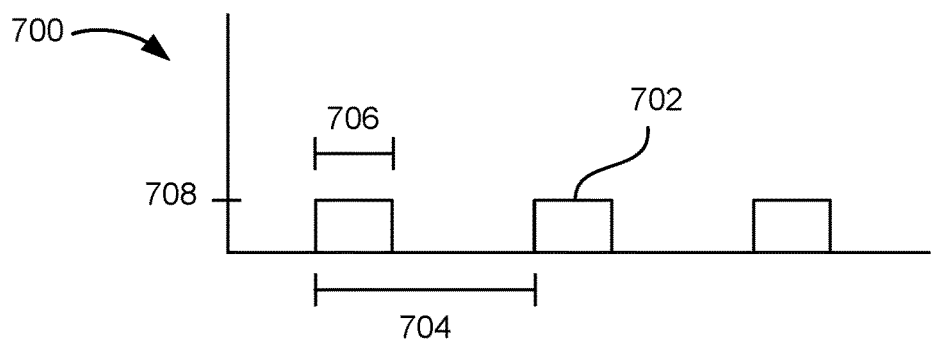
FIGS. 7-10 illustrate pulse trains of initial and modified output pulse trains of the class D amplifier, according to some embodiments of the present disclosure.
Figure 8:
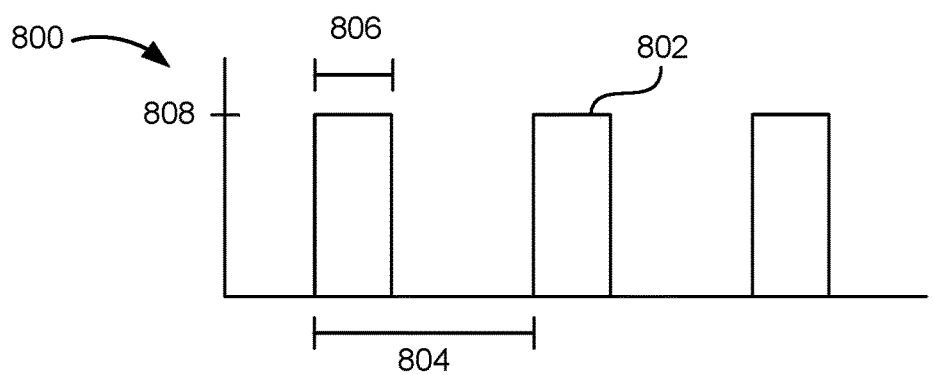
Figure 9:
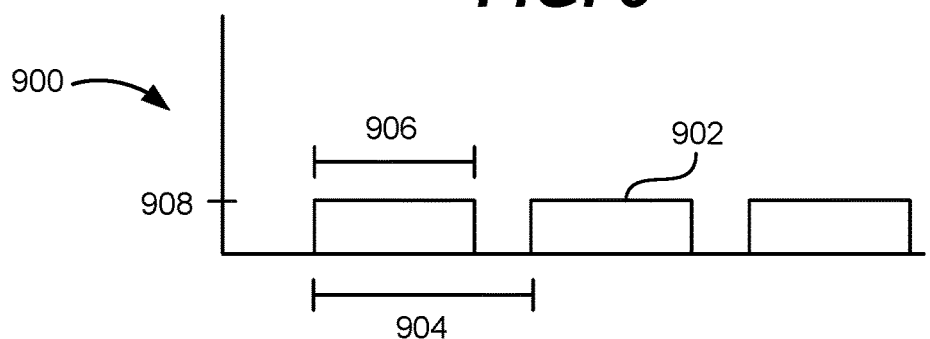
Figure 10:
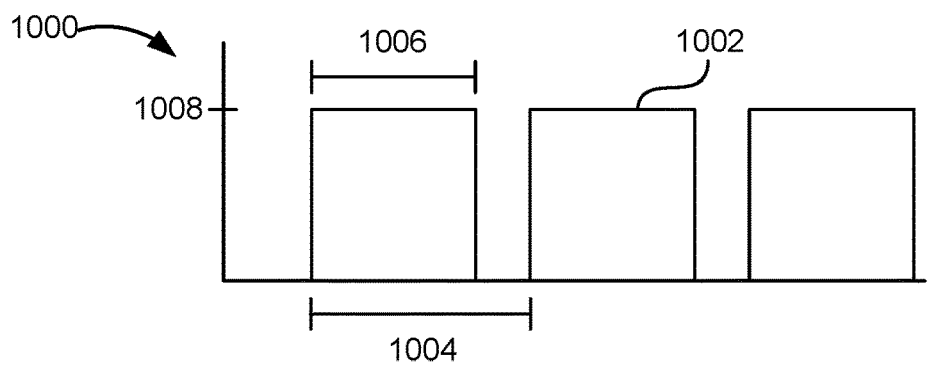

Brief reference is made to FIGS. 7-10, which illustrate pulse trains of initial and modified output pulse trains of the class D amplifier, according to some embodiments of the present disclosure. Specifically, FIG. 7 is a graph 700 of an initial output pulse train 702, FIG. 8 is a graph 800 of a modified output pulse train 802 having a modified amplitude, FIG. 9 is a graph 900 of a modified output pulse train 902 having a modified duty cycle, and FIG. 10 is a graph 1000 of a modified output pulse train 1002 having a modified amplitude and duty cycle, according to some embodiments of the present disclosure.

Initial output pulse train 702 can be an output pulse train that is outputted by the amplifier, e.g., amplifier 612 in FIG. 6, at an initial time. In some embodiments, initial output pulse train 702 can be the output pulse train that achieves the improved power transfer function when the accessory device is at a specific position on the host device. Accordingly, as shown in FIG. 7, initial output pulse train 702 can have a period 704 defined by the fundamental frequency, an initial duty cycle 706 and an initial amplitude 708. As the accessory device moves over the host device, such as when the accessory device is a mouse and the user is moving the mouse to guide the cursor across the screen of a computer device, control logic can modify the drive voltage and/or the duty cycle to modify the output impedance of the amplifier according to the new position of the accessory device.

For instance, the power transmitting circuitry can modify the drive voltage of its amplifier without modifying its frequency such that the amplifier outputs modified output pulse train 802 as shown in FIG. 8. Modified output pulse train 802 can have a period 804 defined by the fundamental frequency, a duty cycle 806 and a modified amplitude 808. Modified amplitude 808 can be different from (e.g., greater than) initial amplitude 708, but period 804 and duty cycle 806 may be the same.

Instead of modifying the drive voltage, some embodiments of the present disclosure can modify the duty cycle instead. As an example, control logic of the power transmitting circuitry can modify the duty cycle of its amplifier without modifying its output frequency such that the amplifier outputs modified output pulse train 902 as shown in FIG. 9. Modified output pulse train 902 can have a period 904 defined by the fundamental frequency, a modified duty cycle 906 and an amplitude 908. Modified duty cycle 906 can be different from (e.g., greater than) initial duty cycle 706, but period 904 and duty cycle 906 may be the same as initial period 704 and initial duty cycle 706.

Furthermore, instead of modifying just the drive voltage or duty cycle, some embodiments of the present disclosure can modify more than one parameter at a time. As an example, the power transmitting circuitry can modify both the drive voltage and the duty cycle of the amplifier without modifying its frequency such that the amplifier outputs modified output pulse train 1002 as shown in FIG. 10. Modified output pulse train 1002 can have a period 1004 defined by the fundamental frequency, a modified duty cycle 1006 and a modified amplitude 1008. Modified duty cycle 1006 and modified amplitude 1008 can both be different from (e.g., greater than) initial duty cycle 706, but period 1004 may be the same as initial period 704 as its output frequency does not change. As can be appreciated with reference to FIGS. 7-10, some embodiments of the present disclosure can modify an output impedance of the amplifier to increase power transfer efficiency without modifying the frequency of the resonator. Accordingly, periods 704, 804, 904, and 1004 can all be the same. Although FIGS. 8 and 10 illustrate modified amplitudes 808 and 1008 to be greater than initial amplitude 708, embodiments are not so limited. Some embodiments can have modified amplitudes that are less than initial amplitude 708 without departing from the spirit and scope of the present disclosure.

The extent to which the initial output pulse train is modified can be proportionate to the degree of separation distance between the corresponding transmitters in the host device and the accessory device. That is, greater separation distances can result in greater changes to the output impedance of the amplifier, which in turn can result in greater changes to the drive voltage and/or duty cycle as discussed herein. The drive voltage and/or duty cycle can dynamically change in accordance with the change of the separation distance between the accessory device and the host device so that the output impedance of the amplifier is constantly tuned to provide power transfer at the improved transfer function anywhere the accessory device is positioned on the host device. In some embodiments, a power tracking controller can be used to tune the output impedance of the amplifier to optimize the power transfer function according to the position of the accessory device and increase power transmitted to the accessory device, as will be discussed further herein.

According to some embodiments of the present disclosure, a power transmitting circuitry can include a power tracking controller, such as a maximum power point tracker (MPPT) device, for maximizing the amount of power transmitted to an accessory device. The MPPT can implement at least two strategies for modifying the output impedance of an amplifier of the power transmitting circuitry to increase power transfer. In a first strategy, the MPPT can generate a control signal to modify an operating voltage of the amplifier and/or a duty cycle of a pulse train outputted by the amplifier to optimize the output power level of the host device; and in a second strategy, the MPPT can generate a control signal that adjusts the output impedance of the amplifier to optimize the operating point of the amplifier, each of which will be discussed further herein.

A. Steering Using MPPT to Optimize an Output Power Level of a Host Device

An MPPT of a power transmitting circuitry can be configured to optimize an output power level of a host device. When an output power level of a host device is optimized, the phase difference between a current and a voltage in an output resonator can be approximately zero, indicating a successful matching between an output impedance of the amplifier and the variance of the instant position of a power receiver unit in the accessory device. To measure the phase difference between the current and the voltage in the output resonator, an output probe can be implemented in the power transmitting circuitry.

For example, with reference back to FIG. 6, power transmitting circuitry 602 can include an MPPT 620 coupled to signal generator module 608 and a voltage regulator 622, as well as an output power probe 624 having sensors 626 coupled to a power line of resonator 604. Output power probe 624 can be configured to measure an amount of power in resonator 604. For instance, output power probe 624 can measure an amount of current and voltage in resonator 604, as well as the frequency and phase at which the current and voltage exists in resonator 604. The amount of power in or sunk in resonator 604 can be indicative of an amount of power outputted by amplifier 612, which can be affected by a degree of coupling between the resonator 604 and a power receiving unit. In some embodiments, an optimized power transfer function between power transmitting circuitry 602 and the receiving power unit can be achieved when an operating point of amplifier 612 is optimized. Optimization can occur when the phase difference between a current and a voltage in an output resonator is approximately zero, indicating a successful matching between an output impedance of the amplifier and the variance of the instant position of a power receiver unit in the accessory device. According to some embodiments, the output impedance of amplifier 612 can be dynamically adjusted to achieve a phase difference between a current and a voltage in resonator 604 that is near zero as the power receiving unit is moving across the host device, as will be discussed further herein.

As mentioned above, the operating point of amplifier 612 for power transmitting circuitry 602 can be controlled by modifying an operating voltage of transistors of amplifier 612 and/or a duty cycle of a pulse train outputted to transistors of amplifier 612 to achieve a change in amplifier's 612 output impedance. In some instances, the operating voltage that is modified can be a drain voltage of output transistors for amplifier 612, or a gate voltage for an analog amplifier. The method in which the operating point of amplifier 612 is changed to modify its output impedance can be performed according to a continuous gradient optimization algorithm that is implemented by the MDPT. In certain cases, the continuous gradient optimization algorithm may not have the transfer function of amplifier 612. However, the monotonicity property of amplifier 612, which can have a non-linear output function, can be taken into consideration by the algorithm. For instance, the algorithm can be based on the dependency of the output impedance from the instant operating point of the amplifier and the variance of the instant position of the power receiver unit (which can be in the accessory device). This dependency can exist because of a mutual resonator coupling between the host device and the accessory device.

According to some embodiments of the present disclosure, the optimization goal of the continuous gradient optimization algorithm can be achieved by performing successive approximation steps where each operating point parameter, e.g., control voltage or duty cycle, is incrementally adjusted upward or downward. The operating point parameters can be adjusted one at a time in a sequential manner, and each time an operating point parameter is adjusted, the newly outputted phase difference between a current and a voltage in resonator 604 can be measured by output power probe 624 to determine whether the newly outputted phase difference is or further approaches approximately zero.

As an example, during a first iteration of a cycle, drive voltage 616 can be modified which causes amplifier 612 to output, at nodes A and B, a first power level with an output impedance that has a first phase difference between a first current and a first voltage of the first power level. During a second iteration, a duty cycle of the output power of amplifier 612 can be modified to a degree that is proportionate to the first phase difference between the first current and first voltage of the first power level. The modified duty cycle can cause amplifier 612 to output a second power level with an output impedance that has a second phase difference between a second current and a second voltage of the second power level that is or approaches zero. This cycle can repeat continuously to optimize the output power level of the host device with respect to the location of the accessory device. It is to be appreciated that modifying the drive voltage and the duty cycle does not have to be performed once for each cycle, but that any number of modifications for the drive voltage and the duty cycle can be performed per cycle. For instance, MPPT 620 can modify drive voltage 616 once and modify the duty cycle of amplifier 612 twice per cycle. For the first modification of the duty cycle, the time during which a transistor is ON can be modified; and for the second modification of the duty cycle, the time during which the transistor is OFF can be modified.

This sequential adjustment of the operating point parameters can be continuously repeated so that the output impedance is continually changing in an effort to maintain a zero phase difference between the current and the voltage existing in resonator 604. That way, the power transmitting circuitry can increase its power transfer function with a receiving power unit in an accessory device regardless of where the accessory device is positioned on the host device.

In some situations, the accessory device can move across the host device in a quick and sporadic motion, such as when the accessory device is a computer mouse and the host device is a power mouse pad. Accordingly, the phase difference between the current and the voltage in resonator 604 may need to be calculated in a short amount of time so that the power in resonator 604 can be measured at a high frequency. To achieve this quick calculation, outputs of two zero crossing comparators (one for current and one for the voltage for the power in resonator 604) can be compared to one another via a logical operation using logic components, such as an exclusive OR (XOR) logic function. An XOR function can output the phase difference between the current and the voltage when the two outputs are different, while not outputting any phase difference, or outputting a zero phase difference, when the two outputs are the same. The result of the XOR function can represent a degree of phase difference between the current and the voltage in resonator 604.

In some embodiments, MPPT 620 can use the determined degree of phase difference to generate a control signal to modify the output impedance of amplifier 612 that compensates for the phase difference to decrease the difference back to zero. The result of the execution of the control signal can be proportional to the determined degree of phase difference between the current and the voltage in resonator 604. For instance, an XOR gate in MPPT 620 can generate a sequence of HI logic pulses whose duration is proportional to the determined phase mismatch. The HI logic pulses in the sequence can be integrated (for example with moving average) and then provided as a convergence criteria to the continuous gradient optimization algorithm. The algorithm can then generate a control signal based on the convergence criteria to control one or more operating point parameters of amplifier 612 to compensate for the phase mismatch and thus increase the output power level of amplifier 612 to the power receiving unit, thereby optimizing the output power level of the host device in turn.

B. Steering Using MPPT to Optimize Amplifier Efficiency

In addition to optimizing an output power level of a host device, an MPPT of a power transmitting circuitry can be also be configured to optimize the operational efficiency of an amplifier of the host device. When the efficiency of the amplifier is optimized, the magnitude of power outputted by the host device can be substantially equal to an amount of power inputted into the host device. That way, the host device can increase its outputted power to an accessory device given the magnitude of inputted power. In some embodiments, the MPPT of the host device can measure an amount of power inputted to a power transmitting circuitry of the host device to enable the MPPT to increase the efficiency of the amplifier.

As an example, with reference to FIG. 6, power transmitting circuitry 602 can further include an input power sensor 624 coupled to MPPT 620. Input power sensor 624 can be configured to measure how much power is flowing from input power 615 provided by an external source, such as a computing device providing power through a USB cable. During normal operation, the amount of current provided by the external source can fluctuate. This fluctuation can be sensed by input power sensor 624 and the corresponding sense data can be received by MPPT 620. In some embodiments, MPPT 620 can calculate a difference between the input power from the external source and the output power of amplifier 612 and use this difference as a maximization factor in the continuous gradient optimization algorithm to optimize the efficiency of amplifier 612. The optimization can be performed by generating a control signal that modifies an operating point parameter, e.g., control voltage and duty cycle, of amplifier 612 to modify the output impedance of amplifier 612. The outputted impedance can result in a power output that is substantially equal to the input power level sensed by input power sensor 624. That way, the improved power level outputted by the host device can be maintained regardless of the fluctuations from the external power source.

Figure 11:
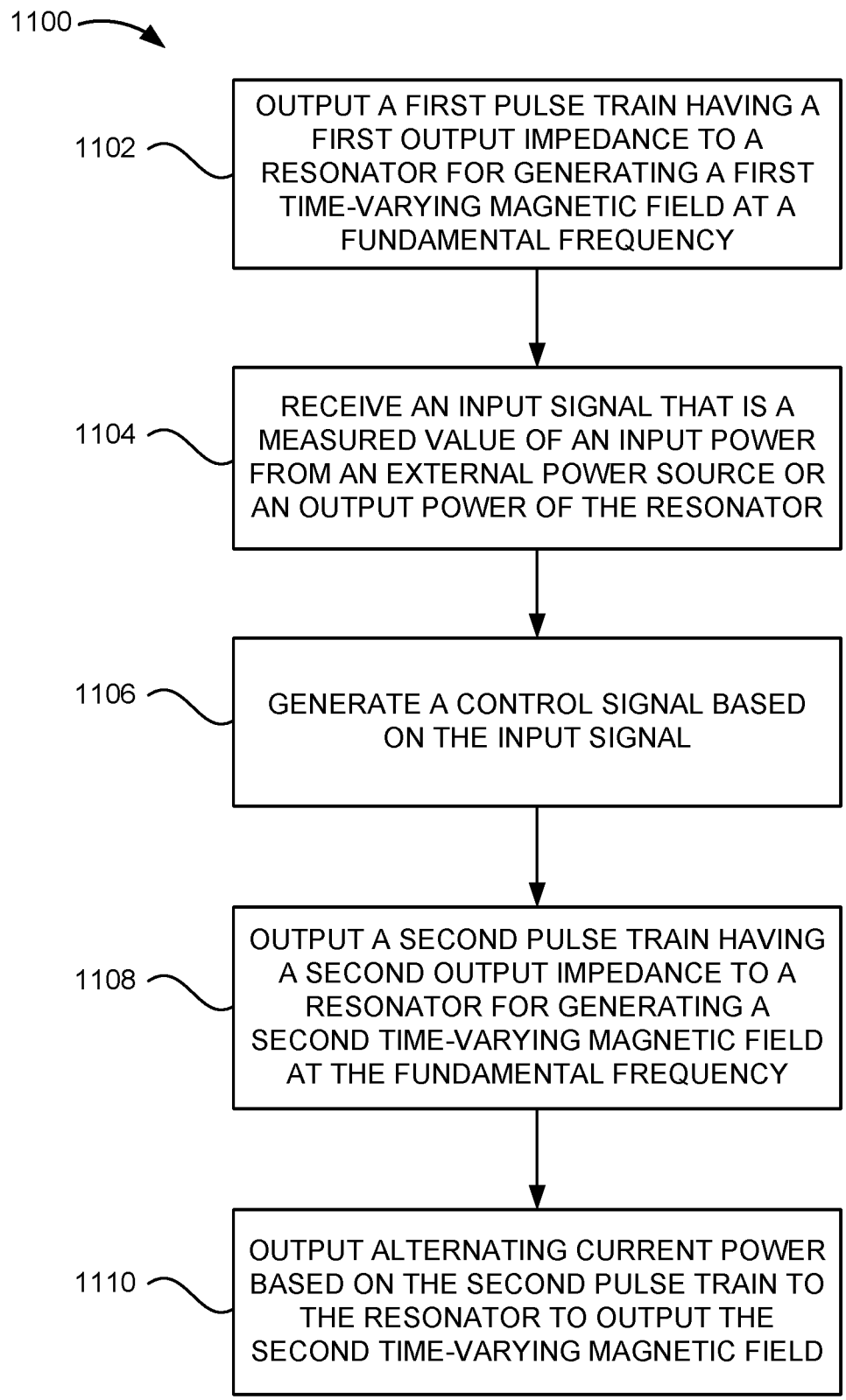
FIG. 11 is a flow chart of an exemplary method of modifying an output impedance of an amplifier of a power transmitting circuitry of a host device to increase its power transfer function with an accessory device, according to some embodiments of the present disclosure.

IV. Method of Modifying Output Impedance of Amplifier to Increase Transfer Function FIG. 11 is a flow chart 1100 of an exemplary method of modifying an output impedance of an amplifier of a power transmitting circuitry of a host device to increase its power transfer function with an accessory device, according to some embodiments of the present disclosure. At block 1102, a first pulse train having a first output impedance can be outputted by an amplifier of a power transmitting circuitry to a resonator circuit for generating a first time-varying magnetic field at a fundamental frequency. As an example, if an accessory device is moving from position A to position B during use, power transmitting circuitry in a host device can provide the first time-varying magnetic field at position A. The first output impedance of the amplifier, e.g., amplifier 612 in FIG. 6, can be specifically tuned to increase the power transfer function between the host device, e.g., host device 410 in FIG. 4, and the accessory device, e.g., accessory device 460 in FIG. 4, when the accessory device is at position A, e.g., position 308 in FIG. 3. According to some embodiments of the present disclosure, tuning of the output impedance can be performed by modifying a control voltage of an amplifier and/or modifying a duty cycle of the amplifier output to a resonator circuit by control logic, e.g., control logic 610 and/or MPPT 620, as discussed herein with respect to FIG. 6.

At block 1104, an input signal can be received by the power transmitting circuitry. In some embodiments, the input signal is a measured value of an input power from an external power source. For instance, the input signal can be a measured current value by a sensor (e.g., sensor 624 in FIG. 6) of the input power from a computing device providing power through a USB cable. The input signal can also be a measured power at a resonator (e.g., resonator 604 in FIG. 6). The input signal can be received by an MPPT, such as MPPT 620 in FIG. 6, and can use the input signal to generate a control signal based on the input signal at block 1106. The control signal can be used to control the operation of the power transmitting circuitry to achieve certain functions.

As an example, the MPPT can generate a voltage control signal and send the voltage control signal to a voltage regulator, e.g., voltage regulator 622 in FIG. 6, to change a control voltage of the amplifier to modify the output impedance of the amplifier. The control voltage can be a drain voltage (e.g., drive voltage) of transistors in the amplifier configured as a digital amplifier; or, the control voltage can be a gate voltage of transistors in the amplifier configured as an analog amplifier. The voltage control signal can be generated based on a phase difference between a current and a voltage of power outputted by the amplifier that varies based on the position of the accessory device relative to the host device so that the MPPT can modify the drive voltage to increase the power transfer function at the position of the accessory device. For instance, the MPPT can measure a phase of a current and a voltage at the output stage of the amplifier and then compare the phase of the current with the phase of the voltage to determine a phase difference between them. This phase difference can then be used in an XOR function to generate a control signal for modifying the operation of the amplifier to decrease the phase difference to zero, as discussed herein with respect to FIG. 6.

The MPPT can also generate a duty cycle control signal and send the duty cycle control signal to a control logic of a signal generator module, e.g., signal generator module 608 in FIG. 6. The control logic can modify the duty cycle of an input signal to the amplifier so that the duty cycle of the output of the amplifier is changed, thereby changing the output impedance (and thus the phase of the output current and voltage) of the amplifier. The duty cycle control signal can be generated based on a phase difference between a current and a voltage of power outputted by the amplifier that varies based on the position of the accessory device relative to the host device so that the MPPT can modify the duty cycle to increase the power transfer function at the position of the accessory device. Modifying the drive voltage and/or duty cycle of the output of the amplifier according to the position of the accessory device can tune the output impedance of the amplifier to increase the power transfer function between the host device and accessory device without having to measure an amount of power received by the accessory device. By not needing feedback from the accessory device, the power transmitting circuitry, according to some embodiments of the present disclosure, can instantly adapt its operating conditions (and thus output power level) to the fast motions of the power receiving unit in the accessory device.

Then, at block 1108, a second pulse train having a second output impedance different from the first output impedance can be outputted by an amplifier, e.g., amplifier 612 in FIG. 6, to a resonator circuit, e.g., resonator circuit 614 in FIG. 6, for generating a second time-varying magnetic field at the fundamental frequency. The second output impedance can be generated by the amplifier according to the modified control voltage and/or duty cycle established by the voltage control signal and/or the duty cycle control signal, e.g., voltage control signal 621 and duty cycle control signal 623 in FIG. 6. The second time-varying magnetic field can be outputted at the same fundamental frequency as the first time-varying magnetic field, but with different amplitudes and/or periods defined by the modified drive voltage and/or duty cycles, as discussed herein with respect to FIGS. 7-10. Continuing with the example discussed at block 1102, the second output impedance can be outputted when accessory device moves to position B, such as position 310 in FIG. 3. At position B, the power transmitting circuitry can modify the output impedance of the amplifier to be specifically turned to increase the power transfer function between the host device and the accessory device when the accessory device is at position B.

Then, at block 1110, alternating current (AC) power based on the second pulse train can be outputted to the resonator, e.g., resonator 604 in FIG. 6, to output the second time-varying magnetic field. The AC power can be provided by a resonator circuit, e.g., resonator circuit 614 in FIG. 6 which can be an LC tank. The output AC power can then excite the resonator and cause the resonator to output a time-varying magnetic field for providing power to the accessory device according to the output impedance of the amplifier.

Instead of modifying the output frequency of the resonator, power transmitting circuity according to some embodiments of the present disclosure can steer the output impedance of its amplifier by modifying a drive voltage of amplifier and/or modifying duty cycle to output a unique pulse train that causes a resonator to generate a time-varying magnetic field that increases the transfer function with an accessory device. The drive voltage and/or duty cycle can dynamically change in accordance with the change of the separation distance between the accessory device and the host device so that the output impedance of the amplifier is constantly tuned to provide power transfer at the improved transfer function anywhere the accessory device is positioned on the host device. In some embodiments, the drive voltage and/or duty cycle can be dynamically changed without measuring an operation status of the accessory device. This enables the wireless charging system to reduce latency and enables the operation of the host device to be steered more effectively to improve power transfer efficiency. Accordingly, the wireless charging system can provide high power transfer efficiency in a dynamic manner as the accessory device moves around the host device.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

What is claimed is:

1. A wireless charging system comprising:
   an accessory device comprising:
      a processor configured to operate the accessory device;
      a receiver coil configured to interact with a magnetic field to generate an electrical current; and
      power receiving circuitry coupled to the receiver coil and the processor, the power receiving circuitry configured to receive the generated electrical current and provide at least a portion of received power to the processor; and
   a host device comprising:
      a housing having a charging surface; and
      power transmitting circuitry coupled to a power source, the power transmitting circuitry comprising:
         an inductive transmitter coil positioned below the charging surface, the inductive transmitter coil configured to receive a first power and generate magnetic field in a region above the charging surface using the first power;
         an amplifier coupled to the inductive transmitter coil and configured to output the first power to the inductive transmitter coil;
         an output sensor coupled to the inductive transmitter coil and configured to measure the first power to the inductive transmitter coil; and
         a power tracking controller coupled to the sensor probe, the power tracking controller is configured to:
            receive measurement of the first power including a phase of a first current and phase of a first voltage of the first power; and
            generate a control signal based on the measured first power to modify an operation of the amplifier,
         wherein the amplifier is configured to receive the control signal from the power tracking controller and modify its output impedance to output a second power different from the first power.

2. The wireless charging system of claim 1, wherein the power tracking controller is further configured to:
   determine a difference between the phase of the first current and the phase of the first voltage of the first power;
   perform an exclusive OR (XOR) logic function on the phase of the first current and the phase of the first voltage of the first power; and
   generate the control signal based on a result of the XOR logic function to cause the amplifier to output the second power different from the first power, wherein the second power has a phase difference between a phase of a second current and a phase of a second voltage that is near zero.

3. The wireless charging system of claim 1, wherein the power tracking controller is coupled to a sensor configured to measure an input power flowing from the power source.

4. The wireless charging system of claim 3, wherein the power tracking controller is further configured to:
   determine a difference between the input power and the first power; and
   generate the control signal based on the difference between the input power and the first power to cause the amplifier to output the second power different from the first power.

5. The wireless charging system of claim 1, wherein the control signal is a voltage control signal that modifies a drain voltage for transistors in the amplifier to modify an amplitude of the second power.

6. The wireless charging system of claim 1, wherein the amplifier includes transistors and is configured as a class D amplifier, and the control signal is a duty cycle control signal that modifies a duty cycle of the transistors in the amplifier to modify a duty cycle of the second power.

7. The wireless charging system of claim 1, wherein the host device is a powered mouse pad and the accessory device is a computer mouse configured to receive wireless power from the host device while positioned on the charging surface.

8. A charging device for wirelessly charging a computer accessory device, the charging device comprising:
   a housing having a charging surface; and
   power transmitting circuitry coupled to a power source, the power transmitting circuitry comprising:
      an inductive transmitter coil positioned below the charging surface, the inductive transmitter coil configured to receive a first power and generate magnetic field in a region above the charging surface using the first power;
      an amplifier coupled to the inductive transmitter coil and configured to output the first power to the inductive transmitter coil; and
      a power tracking controller configured to receive measurement of the first power outputted by the amplifier and generate a control signal based on the first power to modify an operation of the amplifier, wherein the amplifier is configured to receive the control signal from the power tracking controller and modify its output impedance to output a second power different from the first power, wherein the power tracking controller is coupled to a sensor configured to measure an input power flowing from the power source, and the power tracking controller is further configured to:

determine a difference between the input power and the first power; and generate the control signal based on the difference between the input power and the first power to cause the amplifier to output the second power different from the first power.

9. The charging device of claim 8, wherein the measurement of the first power includes a phase of a first current and phase of a first voltage of the first power, and the power tracking controller is further configured to:

determine a difference between the phase of the first current and the phase of the first voltage of the first power;

perform an exclusive OR (XOR) logic function on the phase of the first current and the phase of the first voltage of the first power; and generate the control signal based on a result of the XOR logic function to cause the amplifier to output the second power different from the first power, wherein the second power has a phase difference between a phase of a second current and a phase of a second voltage that is near zero.

10. The charging device of claim 8, wherein the amplifier is a class D amplifier and the modifying its output impedance comprises performing pulse-width modulation to control one or more transistors to output a pulse train having an amplitude and a duty cycle.

11. The charging device of claim 10, wherein the control signal is a voltage control signal that modifies a drain voltage for transistors in the amplifier to modify an amplitude of the second power.

12. The charging device of claim 10, wherein the control signal is a duty cycle control signal that modifies a duty cycle of the transistors in the amplifier to modify a duty cycle of the second power.

13. The charging device of claim 8, wherein the charging device is a powered mouse pad and the accessory device is a computer mouse configured to receive wireless power from the host device while positioned on the charging surface.

14. A method for providing wireless power from a charging device coupled to a power source to a computer accessory device, the method comprising:

outputting, by a power tracking controller, a first control signal to an amplifier causing the amplifier to output a first power to a resonator circuitry causing a generation of a first time-varying magnetic field at a fundamental frequency;

receiving, by the power tracking controller, an input signal corresponding to a measured value of the first power outputted by the amplifier;

in response to receiving the input signal, generating, by the power tracking controller, a second control signal based on the measured value of the first power; and outputting, by the power tracking controller, the second control signal to the amplifier causing a modification to an output impedance of the amplifier and a generation of a second power different from the first power, the second power is output to the resonator circuitry for generating a second time-varying magnetic field different from the first time-varying magnetic field at a same fundamental frequency, wherein the power tracking controller is coupled to a sensor configured to measure an input power flowing from the power source, and generating the second control signal based on the measured value of the first power includes:

determining a difference between the input power and the first power; and generating the control signal based on the difference between the input power and the first power to cause the amplifier to output the second power different from the first power.

15. The method of claim 14, wherein the measurement of the first power includes a phase of a first current and phase of a first voltage of the first power, and generating the second control signal based on the measured value of the first power includes:

determining a difference between the phase of the first current and the phase of the first voltage of the first power;

performing an exclusive OR (XOR) logic function on the phase of the first current and the phase of the first voltage of the first power; and generating the control signal based on a result of the XOR logic function to cause the amplifier to output the second power different from the first power, wherein the second power has a phase difference between a phase of a second current and a phase of a second voltage that is near zero.

16. The method of claim 14, wherein the first and second control signals are voltage control signals that are sent to a voltage regulator to modify respective drive voltages of the amplifier.

17. The method of claim 14, wherein the first and second control signals are pulse-width modulated signals with the first power having a different duty cycle than the second power.

* * * * *